United States Patent [19]

Ikuhara et al.

[11] Patent Number: 4,835,492
[45] Date of Patent: May 30, 1989

[54] VOLTAGE CONTROLLED OSCILLATOR HAVING CONSTANT TUNING BIAS VOLTAGE

[75] Inventors: Hideyuki Ikuhara, Suita; Akira Usui, Takatsuki; Kazuhiko Kubo, Osaka; Hiroyuki Nagai, Ibaraki; Tetsuo Kutsuki, Toyonaka, all of Japan

[73] Assignee: Matsushita Electric Industrial Co., Ltd., Osaka, Japan

[21] Appl. No.: 163,814

[22] PCT Filed: Jun. 18, 1987

[86] PCT No.: PCT/JP87/00397
§ 371 Date: Feb. 11, 1988
§ 102(e) Date: Feb. 11, 1988

[87] PCT. Pub. No.: WO 87/07991
PCT. Pub. Date: Dec. 30, 1987

[30] Foreign Application Priority Data

Jun. 20, 1986 [JP] Japan ................ 61-145291

[51] Int. Cl.$^4$ ............ H03B 5/18; H03L 1/00
[52] U.S. Cl. .............. 331/117 D; 331/175; 331/177 V
[58] Field of Search ......... 331/36 C, 96, 109, 117 D, 331/175, 177 V

[56] References Cited

U.S. PATENT DOCUMENTS 4,751,475 6/1988 Kubo et al. ............... 331/177 V

FOREIGN PATENT DOCUMENTS 51-81055 6/1976 Japan .
54-122705 8/1979 Japan .
59-27614 2/1984 Japan .
60-74335 5/1985 Japan .
62-31205 2/1987 Japan ............... 331/36 C

OTHER PUBLICATIONS

National Technical Report TV62-0004 Apr. 1985 vol. 31 No. 2 (no translation) pp. 115–123.

Primary Examiner—Siegfried H. Grimm
Attorney, Agent, or Firm—Stevens, Davis, Miller & Mosher

[57] ABSTRACT

Disclosed is a local oscillator using a dielectric coaxial resonator (27), which is availably used as a fixed local oscillator in double-spot tuners and CATV converters, and which is arranged so that an AFC voltage is applied to a variable-capacitance diode (23) from an output terminal (E) of a frequency control circuit through a first resistor (35), the variable-capacitance diode having its one end being connected to a center conductor of a dielectric coaxial resonator (27) through a capacitor (25) and its other end being AC grounded, and that a first reference potential ($V_A$) lower than a source voltage ($V_{CC}$) by a predetermined value is given to the variable-capacitance diode (23), the one end of the variable-capacitance diode (23) being connected to the source voltage ($V_{CC}$) through a second resistor (22), whereby the voltage impressed across the variable-capacitance diode (23) can be kept constant regardless of a variation in the source voltage to thereby prevent the oscillation frequency from fluctuating.

3 Claims, 3 Drawing Sheets

VOLTAGE CONTROLLED OSCILLATOR HAVING CONSTANT TUNING BIAS VOLTAGE

TECHNICAL FIELD

The present invention relates to a local oscillator which is used as a fixed local oscillator in double super type tuners or in CATV converters.

BACKGROUND ART

Recently, a lot of systems using a band of 800 to 1000 MHz have been employed in mobile radio communications, such as mobile telephone communications and the like. With the advance of such radio communications, coaxial resonators using dielectric ceramics have been availably employed as local oscillators for the communication appliances. Further, with the advance of CATV systems, such resonators have been employed as local oscillators for double super type tuners suitable for multichannel reception.

The aforementioned, prior art local oscillators will be described hereunder with reference to the drawings.

In FIG. 1, the reference numeral 1 designates a part of an AFC detector, in which an AFC output circuit is made up of transistors 2–10 and resistors 11–17 in the form of a current-mirror type. The reference numeral 18 designates an AFC output resistor and the reference numerals 19 and 22 designate resistors for applying a voltage to a variable-capacitance diode 23. The reference numerals 20 and 21 designate resistors for providing an AFC center voltage, the resistor 21 being a variable resistor for adjusting the oscillation frequency. The reference numeral 24 designates a direct-current blocking capacitor, the reference numerals 25 and 26 designate coupling capacitors, the reference numeral 27 designates a resonator using a dielectric, and the reference numeral 28 designates an oscillating circuit.

FIG. 2 is a block diagram of a system related to the oscillator. In FIG. 2, the system comprises a mixer 41, an intermediate-frequency amplifier 42, an AFC circuit 43 and a local oscillator 44. The mixer 41 mixes an input signal with an output signal of the local oscillator 44 so as to generate an intermediate-frequency signal having a frequency which is a difference between the respective frequencies of the input signal and the output signal of the local oscillator 44. The intermediate-frequency signal is amplified by the intermediate-frequency amplifier 42. The intermediate-frequency signal taken out from a part of the intermediate-frequency amplifier 42 is applied to the AFC circuit 43. The AFC circuit 43 detects a deviation of the frequency of the inputted intermediate-difference signal from the original intermediate frequency and applies a detection voltage representing the deviation to the local oscillator 44.

In the following, the operation of the AFC circuit will be described with reference to FIG. 3. In FIG. 3, Ⓑ shows a characteristic curve showing the AFC detection characteristic, and Ⓐ shows a characteristic line showing the AFC control sensitivity characteristic. If free-running intermediate frequency is shifted to a higher value of $f_1$ due to a deviation of the oscillation frequency, the frequency is controlled by the AFC function so as to be pulled into a lower frequency value of $f_2$. Accordingly, the AFC control sensitivity characteristics shown by Ⓐ must have the inclination that the intermediate frequency is increased as the control voltage of the AFC circuit increases. Accordingly, in the case of lower-side heterodyne in which the local oscillation frequency is established to be lower than the input signal to the mixer 41 of FIG. 2 by a value of the intermediate frequency, the local oscillation frequency must change in reverse proportion to the variation in the control voltage of the AFC circuit.

Taking the foregoing matters into consideration, the prior art oscillator will be described more in detail with reference to FIG. 1. As described above, the reference numeral 1 designates a part of the AFC detecting circuit in which switching intermediate-frequency carrier signals reversed to each other in phase are respectively applied to terminals A and B and 90° phase-shifted intermediate-frequency carrier signals are respectively applied to terminals C and D so that the AFC detecting circuit is constructed by a double-balanced differential amplifier. The output load circuit is constituted by a current-mirror circuit composed of the transistors 2–10 and the resistors 11–17, so that the DC potential at an AFC detection voltage output terminal E can be set externally. That is, in the current-mirror circuit, the collector current $I_1$ of the transistor 2 is equal to the collector current $I_2$ of the transistor 7, and further equal to the collector current $I_3$ of the transistor 9. On the other hand, the collector current $I_4$ of the transistor 4 is equal to the collector current $I_5$ of the transistor 6. Accordingly, if the differential amplifier is well balanced, $I_1$ becomes equal to $I_2$, and $I_3$ becomes equal to $I_5$, so that even if any external circuit is connected to the terminal E, there is no current delivery between the amplifier and the external circuit. Accordingly, the DC potential of the terminal E, or in other words, the AFC center potential, can be externally desirably established.

The coaxial resonator 27 using a dielectric is connected to the oscillator 28 through the coupling capacitor 26 on one hand, and further connected through the coupling capacitor 25 to a circuit for controlling AFC and for adjusting oscillation frequency on the other hand. An example of the oscillator using such a coaxial resonator 27 is described in "National Technical Report", page 115 through page 123, April, 1985, particularly in detail in FIG. 20a thereof. The AFC center voltage can be suitably established by applying a divisional potential of the resistors 20 and 21 to the AFC voltage output terminal E. At the same time, the oscillation frequency can be suitably adjusted by changing the resistance value of the resistor 21. The output terminal E is connected through the resistor 19 to the anode of the variable-capacitance diode 23. The cathode of the variable-capacitance diode 23 is AC grounded through the capacitor 24, and further connected through the resistor 22 to a source voltage $V_{CC}$. The coaxial resonator 27 is considered to be equivalent to a parallel resonator of LC (inductance and capacitance). Accordingly, as the parallel capacitance due to the variable-capacitance diode 23 increases, the oscillation frequency determined by the coaxial resonator 27 and the variable-capacitance diode 23 decreases. In the connection as shown in FIG. 1, therefore, as the AFC voltage increases, the capacitance of the variable-capacitance diode 23 increases, the oscillation frequency decreases, and the intermediate frequency becomes higher as shown by the characteristic line A in FIG. 3.

However, the aforementioned prior art oscillator has a disadvantage in that the oscillation frequency is affected by a variation in the source voltage $V_{CC}$. The anode and cathode voltage values $V_A$ and $V_K$ of the variable-capacitance diode 23 are expressed by the following equations:

$$V_A = R_{21} \cdot V_{CC}/(R_{20}+R_{21}) \quad (3)$$

$$V_K = V_{CC} \quad (4)$$

where $R_{20}$ and $R_{21}$ represent the resistance values of the respective resistors 20 and 21.

The potential difference $V_{CD}$ between the opposite ends of the variable-capacitance diode 23 is expressed by the following equation:

$$V_{CD} = V_K - V_A = R_{20} \cdot V_{CC}/(R_{20}+R_{21}) \quad (5)$$

The equation (5) depends on the source voltage $V_{CC}$, so that the capacitance of the variable-capacitance diode 23 is changed by a variation in the source voltage $V_{CC}$. As a result, a problem arises in that the oscillation frequency of the oscillator 28 is affected by a variation in the source voltage $V_{CC}$.

DISCLOSURE OF INVENTION

It is therefore an object of the present invention to provide a local oscillator which is not affected by a variation in the source voltage.

In order to attain the foregoing object, the local oscillator according to the present invention is arranged so that an output terminal of an AFC circuit is connected through a resistor to an AC grounded one end of a variable-capacitance diode, the other end of the variable-capacitance diode being connected to a dielectric coaxial resonator through a capacitor, and that a potential difference between a source voltage and a voltage lowered by a predetermined potential from the source voltage by using a voltage regulator diode or the like is applied to the variable-capacitance diode.

According to the local oscillator of the invention, in the case where the source voltage changes, the AFC center potential changes equally to the change of the source voltage so that the potential difference across the variable-capacitance diode is kept unchanged because the potential difference is determined by the difference between the source voltage and the AFC center voltage. Accordingly, also the capacitance of the variable-capacitance diode is kept unchanged against the change of the source voltage, so that the oscillation frequency is not affected by a variation in the source voltage.

BRIEF DESCRIPTION OF DRAWINGS

Other features and advantages of the present invention will be apparent from the following description taken in connection with the accompanying drawings, wherein.

BEST MODE FOR CARRYING OUT THE INVENTION

An embodiment of the present invention will be described in detail hereunder with reference to the drawings.

Figure 4:
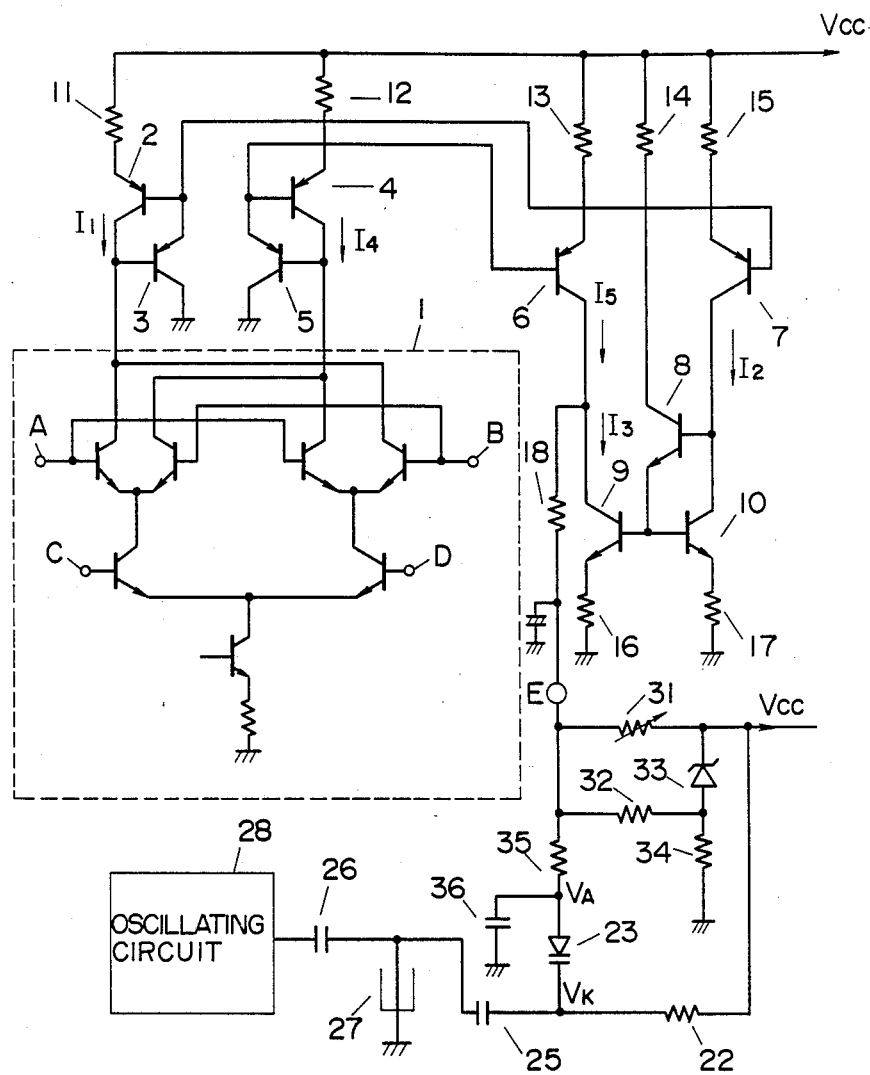
FIG. 4 is a circuit diagram of an embodiment of the local oscillator according to the present invention.

FIG. 4 shows an embodiment of the local oscillator according to the present invention. In FIG. 4, the reference numerals 31 and 32 designate a variable resistor and a resistor, respectively, for establishing an AFC center potential. The reference numeral 33 designates a voltage regulator diode. The reference numeral 34 designates a resistor for causing an electric current to flow into the voltage regulator diode 33. The reference numeral 35 designates a resistor for providing a voltage to an anode of a variable-capacitance diode 23. The reference numeral 36 designates a direct-current cutting capacitor. Other numerals in FIG. 4 designate parts the same or equivalent to those in FIG. 1. That is, the reference numeral 1 designates a part of an AFC circuit; 2-10 current-mirror transistors; 11-17 current-mirror resistors; 18-22 resistors; 23 a variable-capacitance diode; 25 and 26 coupling capacitors; 27 a coaxial resonator using a dielectric; and 28 an oscillating circuit.

Figure 1:
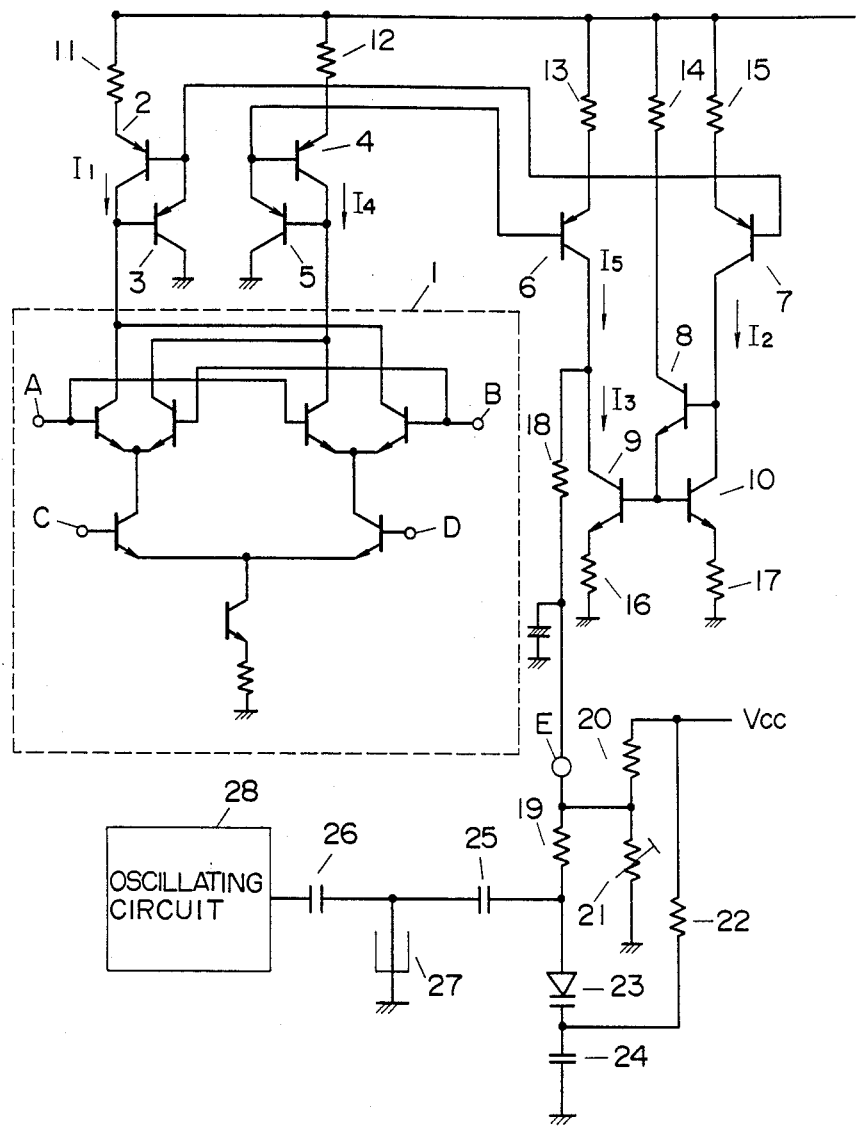
FIG. 1 is a circuit diagram of a prior art local oscillator.
Figure 2:
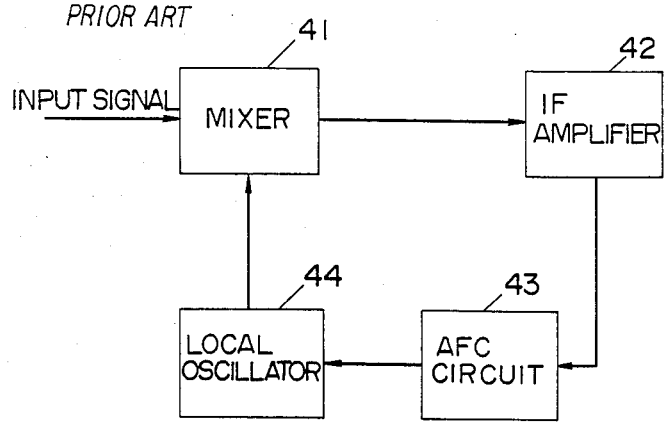
FIG. 2 is a block diagram of a circuit including the oscillator.
Figure 3:
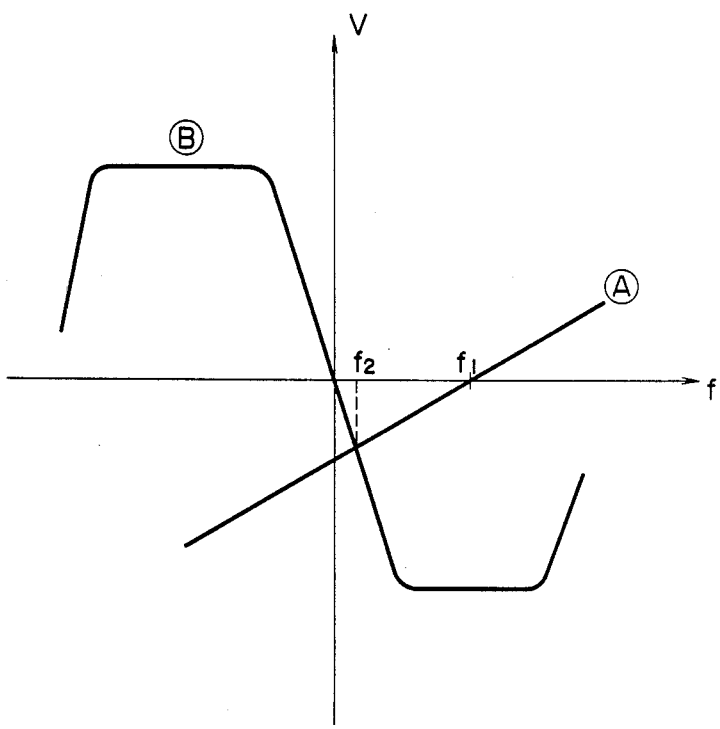
FIG. 3 is a graph of AFC characteristics.

While the operation of the aforementioned local oscillator is described hereunder, detailed description as to part constituted by the transistors 2-10 will be omitted because the part is similar to that of the prior art local oscillator shown in FIG. 1.

The coaxial resonator 27 using a dielectric is connected to the oscillator 28 through the coupling capacitor 26 at its center conductor portion. Further, the coaxial resonator 27 is connected to a cathode of the variable-capacitance diode 23 through the coupling capacitor 25 and connected to a source voltage $V_{CC}$ through the resistor 22 so as to establish the cathode potential of the variable-capacitance diode 23.

On the other hand, the AFC output terminal E is connected to an anode of the variable-capacitance diode 23 through the resistor 35. The anode of the variable-capacitance diode 23 is grounded through the coupled capacitor 36. Further, the AFC output terminal E is connected to the source voltage $V_{CC}$ through the variable resistor 31 and connected to the anode of the voltage regulator diode 33 through the resistor 32. Furthermore, the anode of the voltage regulator diode 33 is connected to the ground through the resistor 34, and the cathode of the same is connected to the source voltage $V_{CC}$.

Accordingly, the AFC center voltage is determined by the resistance division ratio of the resistors 31 and 32. The anode and cathode voltage values $V_A$ and $V_K$ of the variable-capacitance diode 23 are expressed by the equations $$V_A = V_{CC} - \frac{R_{31} \cdot V_Z}{R_{31} + R_{32}} \quad (6)$$

$$V_K = V_{CC} \quad (7)$$

in which $R_{31}$ and $R_{32}$ represent the resistance values of the resistors 31 and 32, and $V_Z$ represents the potential difference between the cathode and anode of the voltage regulator diode 33.

The voltage difference $V_{CD}$ between the opposite ends of the variable-capacitance diode 23 is expressed by the following equation.

$$V_{CD} = V_K - V_A = \frac{R_{31} \cdot V_Z}{R_{31} + R_{32}} \quad (8)$$

The equation (8) holds regardless of a variation in the source voltage $V_{CC}$, so that the capacitance of the variable-capacitance diode can be kept constant against a variation in the source voltage $V_{CC}$.

Accordingly, the oscillation frequency of the oscillator 28 can be kept constant against a variation in the source voltage $V_{CC}$, so that the oscillation frequency is not affected by a variation in the source voltage $V_{CC}$.

INDUSTRIAL APPLICABILITY

As described above, according to the invention, the AFC center potential is established by the source voltage and by the resistance division ratio between a predetermined potential drop by the voltage regulator diode on the basis of the source voltage. Accordingly, the variation in the oscillation frequency due to a variation in the source voltage can be prevented from occurring. Consequently, the oscillator according to the invention is suited to use as a local oscillator in double-spot tuners and CATV converters.

We claim:

1. A local oscillator using a dielectric coaxial resonator, said local oscillator comprising: a variable-capacitance diode with its one end connected to a central conductor of said dielectric coaxial resonator and its other end AC grounded; means for applying a first reference electric potential to a junction between a first resistor and an output terminal of a frequency control circuit connected to said other end of said variable-capacitance diode through said first resistor, said first reference electric potential being set to be lower than an electric potential at a source voltage terminal by a predetermined value; and means for connecting said one end of said variable-capacitance diode to said source voltage terminal through a second resistor.

2. A local oscillator according to claim 1, in which said frequency control circuit is provided with an output circuit of a current-mirror type which serves as an output loading circuit for said frequency control circuit.

3. A local oscillator according to claim 1, in which said means for applying said first reference electric potential comprises a voltage-regulator diode with its one end connected to said source voltage terminal and its other end grounded through a third resistor, and a series circuit composed of fourth and fifth resistors, said series circuit having opposite ends connected to said one and the other ends of said voltage-regulator diode respectively and having an intermediate junction connected to said junction between said output terminal of said frequency control circuit and said first resistor.

* * * * *